United States Patent
Liu et al.

(10) Patent No.: US 10,070,552 B2
(45) Date of Patent: Sep. 4, 2018

(54) ELECTRONIC DEVICE AND COMPONENT MODULE

(71) Applicant: HTC Corporation, Taoyuan (TW)

(72) Inventors: Sheng-Ming Liu, Taoyuan (TW); Chin-Kai Sun, Taoyuan (TW)

(73) Assignee: HTC Corporation, Taoyuan (TW)

( * ) Notice: Subject to any disclaimer, the term of this patent is extended or adjusted under 35 U.S.C. 154(b) by 218 days.

(21) Appl. No.: 14/856,567

(22) Filed: Sep. 17, 2015

(65) Prior Publication Data

US 2017/0086323 A1 Mar. 23, 2017

(51) Int. Cl.
| | |
|---|---|
| *H05K 1/00* | (2006.01) |
| *H05K 7/14* | (2006.01) |
| *H04M 1/02* | (2006.01) |
| *H05K 1/02* | (2006.01) |
| *H05K 1/18* | (2006.01) |

(52) U.S. Cl.
CPC ........ *H05K 7/1427* (2013.01); *H04M 1/0249* (2013.01); *H05K 1/028* (2013.01); *H05K 1/181* (2013.01)

(58) Field of Classification Search
CPC ..... H04M 1/0249; H05K 1/028; H05K 1/181; H05K 7/1427
See application file for complete search history.

(56) References Cited

U.S. PATENT DOCUMENTS

| | | | |
|---|---|---|---|
| 5,329,422 A | | 7/1994 | Sasaki |
| 7,506,450 B2 * | | 3/2009 | Spaulding ............ C09J 7/0203 248/205.3 |
| 8,170,266 B2 * | | 5/2012 | Hopkinson ............ H04R 1/023 361/679.01 |
| 9,310,847 B2 * | | 4/2016 | Casebolt ................ G06F 1/1658 |
| 2008/0048817 A1 * | | 2/2008 | Mahawili ................ H02K 3/26 336/206 |
| 2014/0000844 A1 | | 1/2014 | Chandaria |

FOREIGN PATENT DOCUMENTS

| | | |
|---|---|---|
| CN | 102730623 | 10/2012 |
| TW | M299441 | 10/2006 |
| TW | 200924608 | 6/2009 |
| TW | 201248354 | 12/2012 |

OTHER PUBLICATIONS

"Office Action of Taiwan Counterpart Application", dated May 27, 2016, p. 1-p. 5.

* cited by examiner

*Primary Examiner* — Yuriy Semenenko
(74) *Attorney, Agent, or Firm* — JCIPRNET

(57) ABSTRACT

An electronic device and a component module thereof are provided, wherein the electronic device includes a housing, a component and a flexible substrate. The housing has a mounting region, and the component is disposed in the mounting region. The flexible substrate includes a bonding portion and an extending portion, wherein the bonding portion is disposed between the component and a carrying surface of the mounting region. The mounting portion has a first surface and a second surface opposite to the first surface, wherein the first surface is bonded to the component, and the second surface is bonded to the carrying surface. The extending portion is connected to the bonding portion and extended to the outside of the mounting region.

21 Claims, 5 Drawing Sheets

ELECTRONIC DEVICE AND COMPONENT MODULE

BACKGROUND OF THE INVENTION

1. Field of the Invention

The disclosure relates to an electronic device and a component module thereof, and relates particularly to an electronic device which enables damage free disassembling of components and a component module thereof.

2. Description of Related Art

In recent years, the use of various types of electronic devices, for example, a mobile phone, a tablet computer, a notebook computer, a smart phone and such have become increasingly common, and have been developing in the design areas such as convenience, versatility and aesthetics so as to provide a user with more selection.

Many components are integrated inside an electronic device, such as electronic components or parts and the like. When manufacturing or repairing the electronic device, regardless of whether it is rework, proper recycling of components or changing out replacement parts and such, they all require components to be dismantled. However, along with precision design and miniaturization of components, conventional disassembling methods may not be suitable or may damage the components leading to an increase in manufacturing costs or repair costs.

SUMMARY OF THE INVENTION

The disclosure proposes an electronic device, which enables damage free disassembling of components, and is not only able to achieve simple and fast disassembling of components, but also aids in increasing the manufacturing or repair yield rate.

The electronic device of the disclosure includes a housing, a component and a flexible substrate. The housing has a mounting region and the component is disposed in the mounting region. The flexible substrate includes a bonding portion and an extending portion. The bonding portion is located between the component and a carrying surface of the mounting region, and the bonding portion has a first surface and a second surface opposite to the first surface, wherein the first surface is bonded to the component, and the second surface is bonded to the carrying surface. The extending portion is connected to the bonding portion and extended to an outside of the mounting region.

The disclosure further proposes a component module adapted for the aforementioned electronic device, the component module including the component and the flexible substrate. Simple and fast damage free disassembling of components may be achieved by the component module, and may further increase the manufacturing or repair yield rate.

Based on the above, the disclosure fixes the component at the carrying body of the housing by using the flexible substrate to carry the component, and the extending portion of the flexible substrate extends to the outside of the mounting region of the component. Therefore, when disassembling the component, only the extending portion of the flexible substrate, located outside of the mounting region, is required to be lifted so as to remove the component along with the flexible substrate from the housing together, therefore the disassembling process is simple and fast. In addition, when disassembling in the disclosure, a force is applied to the flexible substrate, and the force is not applied directly to the component, therefore the probability of an external force damaging the component during the disassembling process may be significantly lowered, and may aid in increasing the manufacturing or repair yield rate.

Several exemplary embodiments accompanied with figures are described in detail below to provide a further understanding of the above mentioned features and advantages.

DESCRIPTION OF THE EMBODIMENTS

A loud speaker of a handheld electronic device is described in the following embodiment. In actuality, the applicable ranges of the various technical solutions proposed in the disclosure are not limited hereto. In possible situations, other components of the handheld electronic device may also adopt a similar configuration so as to implement a simple, fast and damage free disassembling. On the other hand, after reading the disclosure a person skilled in the art will understand that other types of electronic devices may similarly fall within the applicable range of the disclosure.

Figure 1:
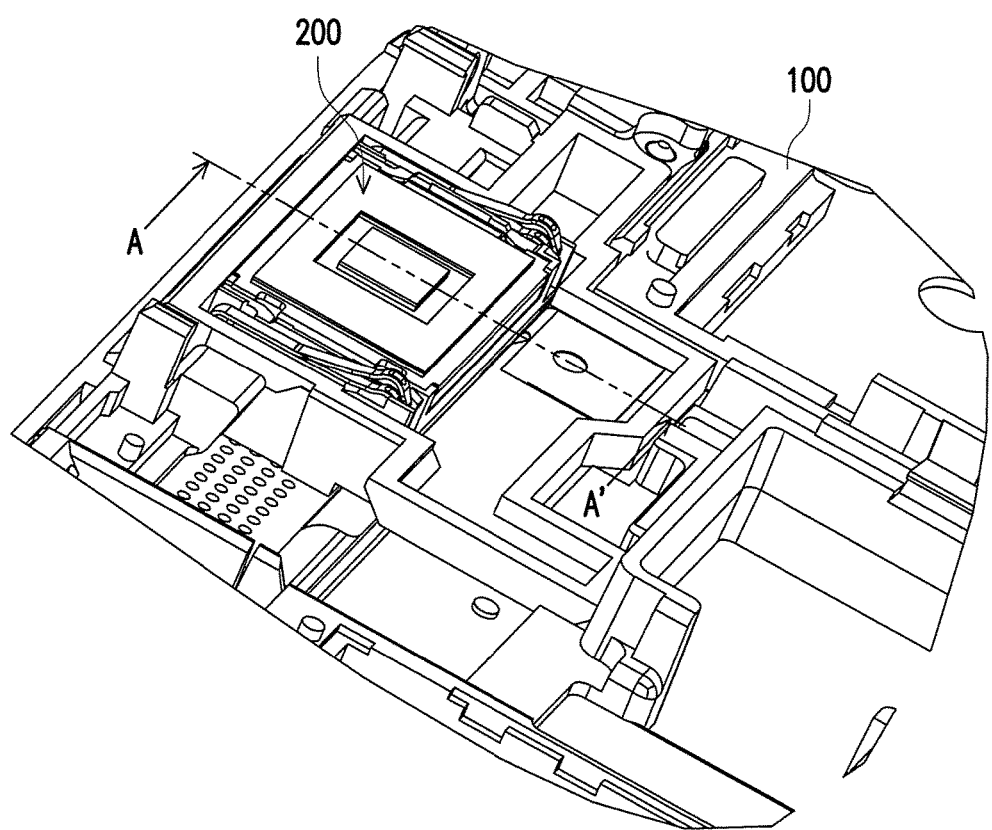
FIG. 1 illustrates a partial structure of an electronic device according to an embodiment of the invention.
Figure 2:
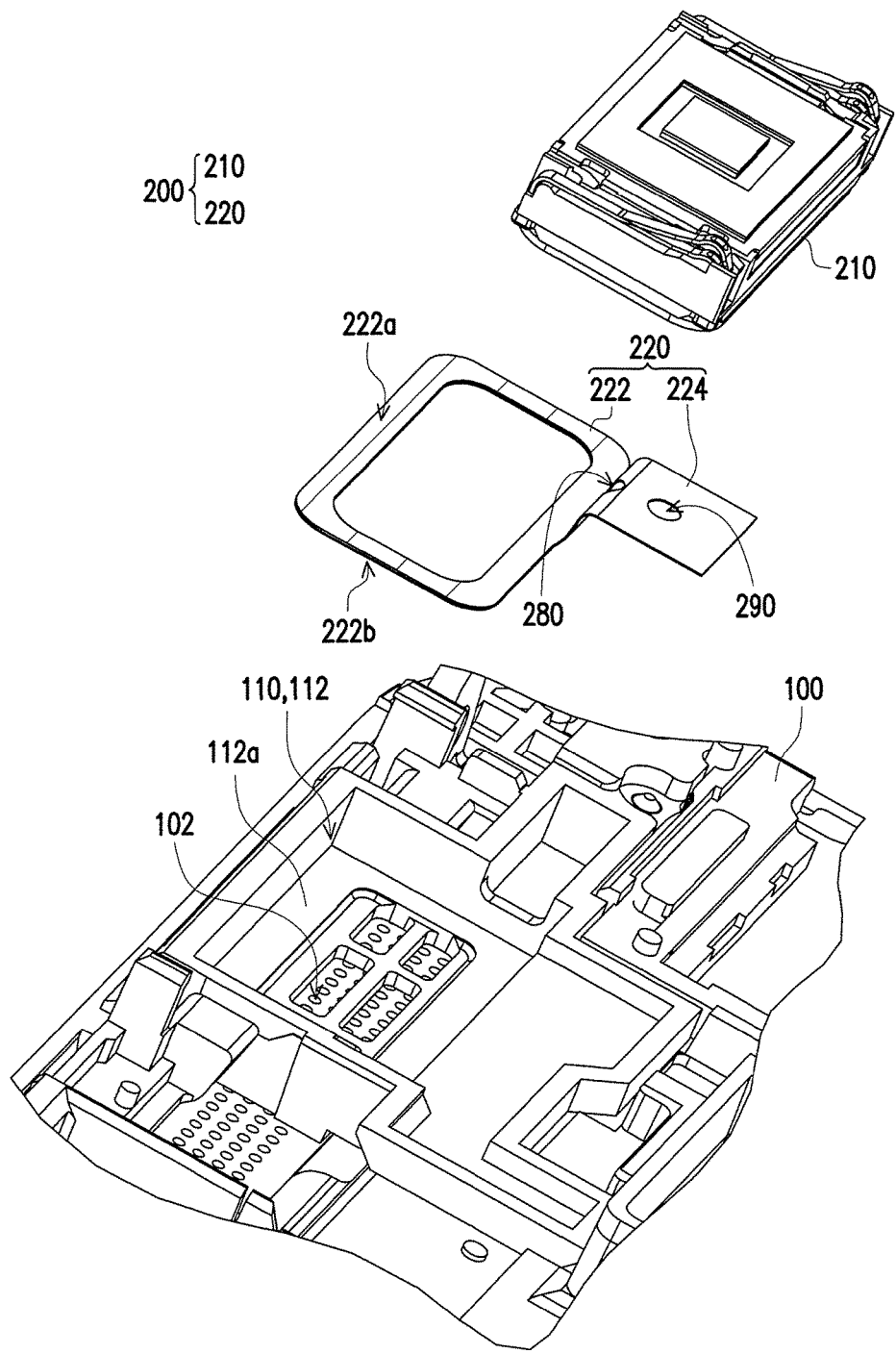
FIG. 2 is an exploded view of the partial structure of FIG. 1.

FIG. 1 illustrates a partial structure of an electronic device according to an embodiment of the invention. FIG. 2 is an exploded view of the partial structure of FIG. 1.

As shown in FIGS. 1 and 2, an electronic device 10 of the present embodiment includes a housing 100, and a component module 200 disposed on the housing 100. The component module 200 includes a component 210 and a flexible substrate 220. Here, the electronic device 10, for example, is a handheld electronic device, and the component 210, for example, is a sound outputting component of the handheld electronic device. When the component 210 is the sound outputting component of the handheld electronic device, the housing 100 further has a plurality of through holes 102 connecting an internal and an external space, so as provide the component 210 to output sound. For example, the component 210 may be a speaker or receiver. In addition, the housing 100 has a mounting region 110, and the component 210 is disposed in the mounting region 110 through the flexible substrate 220. A material of the flexible substrate 220, for example, is polyethylene terephthalate (PET), Mylar or other suitable flexible material. More specifically, the flexible substrate 220 does not have any circuit or traces.

Figure 3:
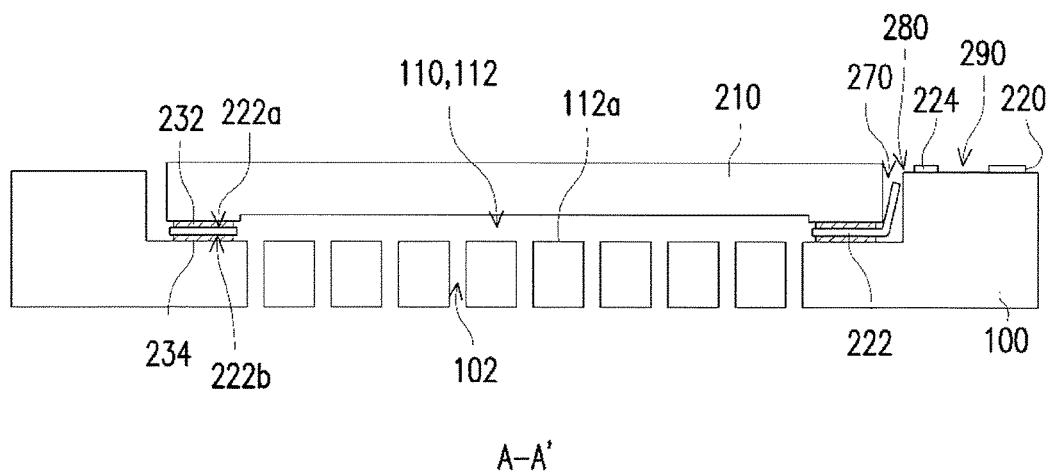
FIG. 3 is a cross-sectional schematic diagram of the partial structure of FIG. 1 along the line A-A'.

FIG. 3 is a cross-sectional schematic diagram of the partial structure of FIG. 1 along the line A-A'. In order to facilitate the description and clearly convey the technical features of the disclosure, FIG. 3 is only a schematic diagram, and a part of the structural details have been omitted. Referring to FIG. 1-3 concurrently, more specifically, the housing 100 of the present embodiment, for example, has a depression 112 disposed at the mounting region 110 and may house the component 210, and a bottom of the depression 112 has a carrying surface 112a for mounting the component 210. The flexible substrate 220 includes a bonding portion 222 located between the component 210 and the carrying surface 112a, and an extending portion 224 connected to the bonding portion 222. The bonding portion 222 has a first surface 222a and a second surface 222b opposite to the first surface 222a, wherein the component 210 is bonded to the first surface 222a, for example, by a first adhesive layer 232 or other method, and the second surface 222b is bonded to the carrying surface 112a, for example, by a second adhesive layer 234 or other method.

The first adhesive layer 232 or the second adhesive layer 234 here, for example, is an adhesive material pre-coated to the surface of the flexible substrate 220 or an adhesive material pre-coated to the component 210 or the carrying surface 112a. Or, the flexible substrate 220 provided by the disclosure may be a double sided adhesive material, so as to provide the first surface 222a and the second surface 222b that have adhesive properties. When assembling the component 210, first a protective film on a single side of the double sided adhesive material (flexible substrate 220) may be removed, so as to expose the first surface 222a having adhesive properties, and bonding the component 210 to the first surface 222a. Then, a protective film on the other side of the double sided adhesive material (flexible substrate 220) may be removed, so as to expose the second surface 222b having adhesive properties, and the flexible substrate 220 along with the component 210 is bonded to the carrying surface 112a.

The extending portion 224 is connected to the bonding portion 222 and extended to the outside of the mounting region 110. In the present embodiment, a gap 270 is formed between the component 210 and an inner wall of the depression 112, and the extending portion 224 extends from the bonding portion 222, passes through the gap 270 and protrudes to the outside of the depression 112. In addition, to prevent the extending portion 224 from occupying internal space of the electronic device 10 or being suspended in the internal space and affecting the assembling of other components and such, the present embodiment has selected to bend the extending portion 224 that is protruding from the depression 112, and an end of the extending portion 224 after bending, for example, may be adhered to the surface of the housing 100 outside of the depression 112 by an adhesive material or innate adhesive properties thereof, or a possible interference structure (such as a slot, plate, bump and the like), so as to fix the end of the extending portion 224.

The present embodiment has selected to form a weakening structure 280 at the bending portion of the extending portion 224. The weakening structure 280 here, for example, are holes penetrating through the extending portion 224 or other design which may weaken the structural strength of the flexible substrate 220, so as to facilitate bending of the flexible substrate 220 along the weakening structure 280. In addition, the flexible substrate 220 of the present embodiment also has a gripping hole 290 penetrating through the end of the extending portion 224. The gripping hole 290 here may provide gripping for a finger of a personnel or tooling to apply force when disassembling the component 210.

Figure 4A:
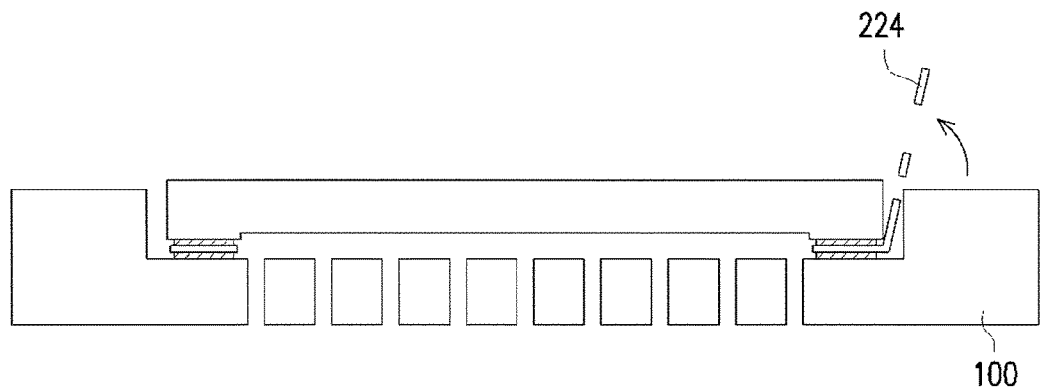
FIG. 4A~4C illustrate a component disassembling process according to an embodiment of the invention.
Figure 4B:
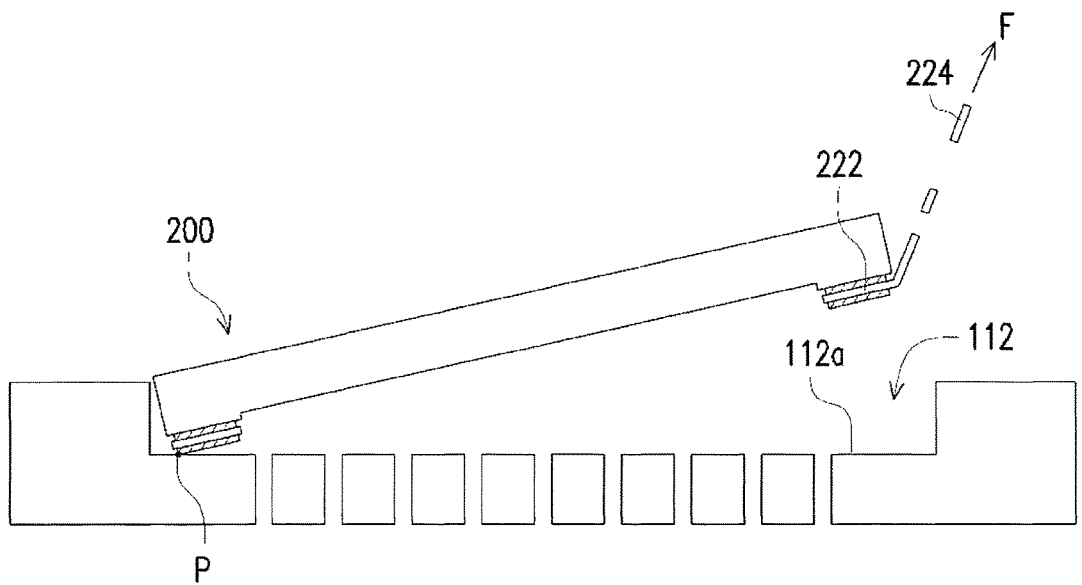
Figure 4C:
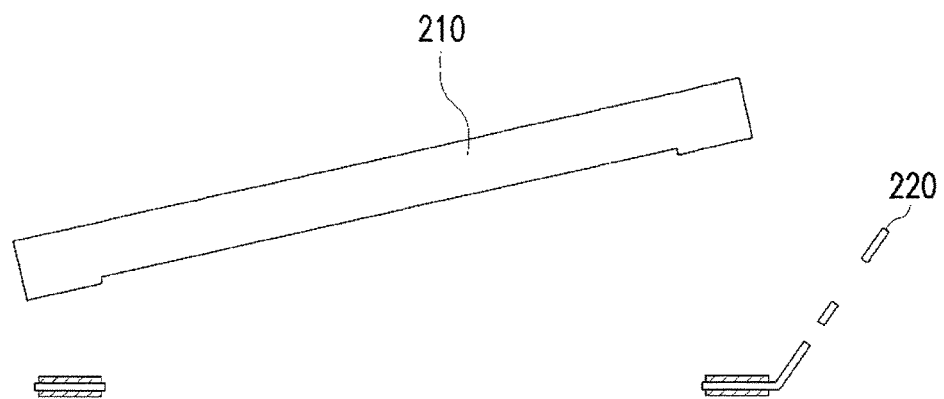

The disassembling process by using the component 210 of the present embodiment will be described below using FIG. 4A~4C. First, as shown in FIG. 4, the end of the extending portion 224 that is fixed to the housing 100 surface may be lifted off from the surface of the housing 100 by a finger or tooling. Next, as shown in FIG. 4B, a pulling force F is applied to the end of the extending portion 224, so as to drive the bonding portion 222 to separate from the carrying surface 112a of the bottom of the depression 112. Here, since the extending portion 224 is located at one side of the bonding portion 222, the component module 20 is rotated such that an end further away from the extending portion 224 acts as a pivot point P, and separated from the carrying surface 112a. After the component module 200 leaves the depression 112, as shown in FIG. 4C, the flexible substrate 220 is removed from the component 210.

Based on the above mentioned, the present embodiment may complete disassembling of the component only by actions such as pulling the flexible substrate 220, and then removing the flexible substrate 220 from the component 210, therefore the disassembling process is simple and fast. At the same time, the entire disassembling process applies force to the flexible substrate 220 instead of applying force directly to the component 210, therefore an external force damaging the component 210 during the disassembling process may be prevented, and this aids in increasing the manufacturing or repair yield rate of the electronic device 10.

Although the aforementioned embodiments accompanied by drawings have described an implementation of the disclosure, the disclosure is not limited thereto. As previously mentioned, the type of electronic device, the type of component itself, configuration and such may all be modified and adjusted accordingly. In addition, a shape or structure of the flexible substrate 220 may also be modified along with actual requirements. For example, the component 210 of the aforementioned embodiment is a sound outputting component (for example, a speaker or headphone), therefore the bonding portion 222 of the flexible substrate 220 is ring-shaped, and is bonded to the component 210, and the central part of the component 210 and the through holes 102 of the housing 100 are exposed, such that the sound emitted by the component 210 is able to be outputted, or the external sound is able to be received through the through holes 102.

Figure 5:
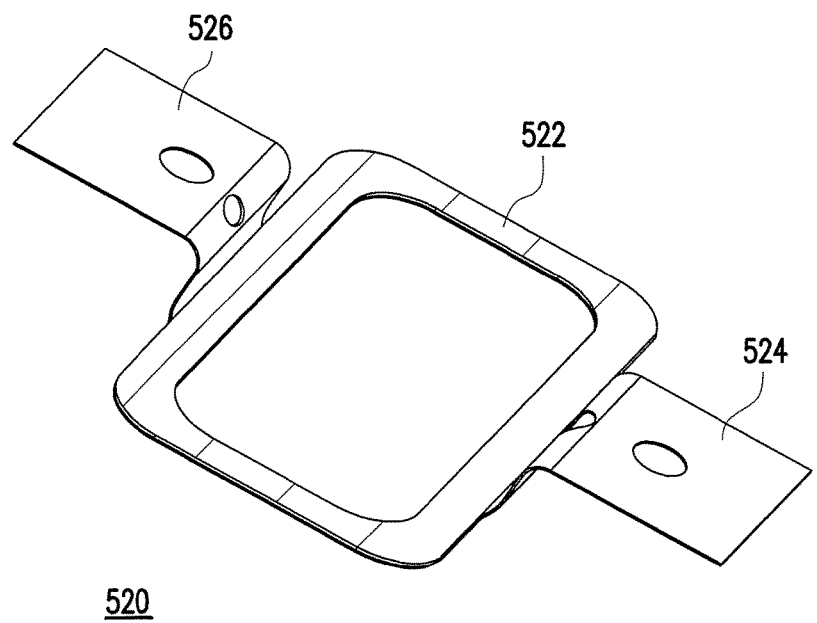
FIG. 5 illustrates a flexible substrate according to another embodiment of the invention.
Figure 6:
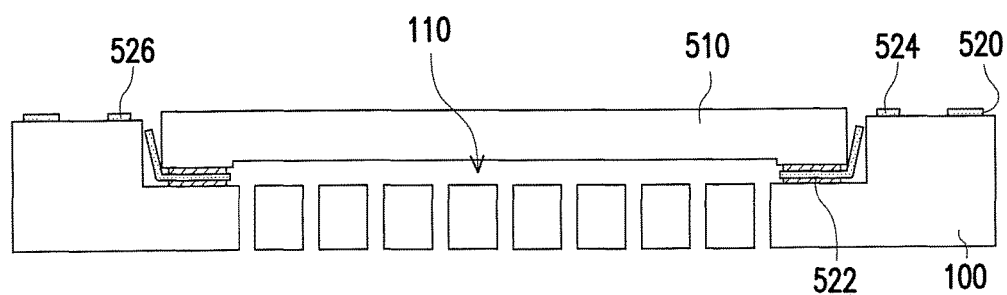
FIG. 6 illustrates a partial cross-sectional structure of an electronic device adopting the flexible substrate of FIG. 5.

Based on the above, FIG. 5 further illustrates a flexible substrate 520 according to another embodiment of the disclosure, and FIG. 6 illustrates a partial cross-sectional structure of an electronic device adopting the flexible substrate 520. The present embodiment and the aforementioned embodiments are similar, wherein the main difference being: The flexible substrate 520 of the present embodiment includes a bonding portion 522 and a first extending portion 524 and a second extending portion 526 which are connected to the two opposite sides of the bonding portion 522 respectively. Here, the first extending portion 524 and the second extending portion 526, for example, are disposed symmetrically at the two opposite sides of the bonding portion 522 respectively. After the component 510 is disposed at the mounting region 110 through the flexible substrate 520, as in the previously mentioned embodiment, the first extending portion 524 and the second extending portion 526 extended to the outside of the mounting region 110 are selected to be bended and fixed to the surface of the housing 100. Of course, the first extending portion 524 and the second extending portion 526 may have the weakening structure 280 and the gripping hole 290 and such design similar to the aforementioned embodiment (as shown in FIG. 2), so as to achieve a similar technical effect, which will not be described again.

In addition, since the flexible substrate 520 of the present embodiment has the first extending portion 524 and the second extending portion 526 disposed symmetrically, when disassembling the component 510, the bonding portion 522 along with the component 510 thereon may be driven to be separated from the mounting region 110 by applying only a pulling force to the first extending portion 524 and the second extending portion 526 at the same time.

The disclosure disclosed by the embodiments above is not intended to limit the disclosure, and a person skilled in the art may make various modifications and variations without departing from the scope or spirit of the disclosure; therefore the scope of the protection of the disclosure should be defined by the scope of the following claims and their equivalents.

What is claimed is:

1. An electronic device, comprising:
a housing, having a mounting region;
a component, disposed in the mounting region;
a flexible substrate, comprising:
a bonding portion, located between the component and a carrying surface of the mounting region, and the bonding portion having a first surface and a second surface opposite to the first surface, wherein the first surface is bonded to the component, the second surface is bonded to the carrying surface, and the bonding portion is ring-shaped; and
an extending portion, connected to the bonding portion and extended to an outside of the mounting region,
wherein a material of the flexible substrate comprises one of polyethylene terephthalate and Mylar.

2. The electronic device as claimed in claim 1, wherein the housing has a depression located at the mounting region, and the component is disposed on the carrying surface of a bottom of the depression.

3. The electronic device as claimed in claim 2, wherein the extending portion passes through a gap between the component and an inner wall of the depression, and extends to an outside of the depression.

4. The electronic device as claimed in claim 3, wherein the extending portion passing through the gap is bent and extends to the outside of the depression.

5. The electronic device as claimed in claim 4, wherein the flexible substrate has a weakening structure located at a bent portion of the extending portion.

6. The electronic device as claimed in claim 5, wherein the weakening structure comprises a hole penetrating through the extending portion.

7. The electronic device as claimed in claim 1, wherein the flexible substrate has a gripping hole penetrating through the extending portion.

8. The electronic device as claimed in claim 1, wherein an end of the extending portion is fixed at a surface of the housing.

9. The electronic device as claimed in claim 1, wherein the extending portion comprises a first extending portion and a second extending portion located at two opposite sides of the bonding portion respectively.

10. The electronic device as claimed in claim 1, wherein the bonding portion is bonded to the component.

11. The electronic device as claimed in claim 1, further comprising a first adhesive layer, disposed between the first surface of the bonding portion and the component.

12. The electronic device as claimed in claim 1, further comprising a second adhesive layer, disposed between the second surface of the bonding portion and the carrying surface.

13. The electronic device as claimed in claim 1, wherein the housing has a plurality of through holes located at the mounting region, to connect an internal space and an external space of the housing, and the component comprises a sound outputting component.

14. A component module, adapted to be disposed on a housing of an electronic device, the housing has a mounting region, the component module comprising:
a component, disposed in the mounting region;
a flexible substrate, comprising:
a bonding portion, having a first surface and a second surface opposite to the first surface, wherein the first surface is bonded to the component, the second surface is bonded to a carrying surface of the mounting region, and the bonding portion is ring-shaped; and
an extending portion, connected to the bonding portion and extended outwards,
wherein a material of the flexible substrate comprises one of polyethylene terephthalate and Mylar.

15. The component module as claimed in claim 14, wherein the flexible substrate has a bent portion at the extending portion and a weakening structure located at the bent portion.

16. The component module as claimed in claim 15, wherein the weakening structure comprises a hole penetrating through the extending portion.

17. The component module as claimed in claim 14, wherein the flexible substrate has a gripping hole penetrating through an end of the extending portion.

18. The component module as claimed in claim 14, wherein the extending portion comprises a first extending portion and a second extending portion located at two opposite sides of the bonding portion respectively.

19. The component module as claimed in claim 14, wherein the bonding portion is bonded to the component.

20. The component module as claimed in claim 14, further comprising a first adhesive layer, disposed between the first surface of the bonding portion and the component.

21. An electronic device, comprising:
a housing, having a mounting region and a depression located at the mounting region;
a component, disposed in the mounting region and on a carrying surface of a bottom of the depression; and
a flexible substrate, comprising:
a bonding portion, located between the component and the carrying surface, and the bonding portion having a first surface and a second surface opposite to the first surface, wherein the first surface is bonded to the component, and the second surface is bonded to the carrying surface;
an extending portion, having a bent portion and connected to the bonding portion and extended to an outside of the mounting region, wherein the extending portion passing through a gap between the component and an inner wall of the depression is bent and extends to an outside of the depression; and
a weakening structure, located at the bent portion of the extending portion and comprising a hole penetrating through the extending portion.

* * * * *